(12) United States Patent
Troxler et al.

(10) Patent No.: US 9,128,137 B2
(45) Date of Patent: Sep. 8, 2015

(54) ELECTRICAL DIAGNOSTIC TOOL

(71) Applicant: Carter Fuel Systems, LLC, Cleveland, OH (US)

(72) Inventors: John E. Troxler, Logansport, IN (US); Richard Harvey, Logansport, IN (US)

(73) Assignee: CARTER FUEL SYSTEMS, LLC, Cleveland, OH (US)

( * ) Notice: Subject to any disclaimer, the term of this patent is extended or adjusted under 35 U.S.C. 154(b) by 245 days.

(21) Appl. No.: 13/757,297

(22) Filed: Feb. 1, 2013

(65) Prior Publication Data
US 2013/0214793 A1    Aug. 22, 2013

Related U.S. Application Data

(60) Provisional application No. 61/594,397, filed on Feb. 3, 2012.

(51) Int. Cl.
 *G01R 31/02* (2006.01)
 *G01R 31/00* (2006.01)
 *F04B 51/00* (2006.01)
 *G01R 31/34* (2006.01)

(52) U.S. Cl.
 CPC ............... *G01R 31/00* (2013.01); *F04B 51/00* (2013.01); *G01R 31/343* (2013.01); *G01R 31/007* (2013.01); *G01R 31/025* (2013.01)

(58) Field of Classification Search
 CPC ........ B60K 35/00; B60K 37/06; G07C 5/008; G07C 5/0808; G06F 11/0742; G06F 11/0748; G06F 11/0769; G06F 11/3068; G06F 11/3013; G06F 11/3055; G01R 31/007; F02F 3/10; F02B 77/08; H04L 12/40117; G01M 15/05; F02D 41/22
 USPC ......... 340/439, 440, 441, 449, 450, 451, 453, 340/459, 462; 701/29, 35, 33; 324/426, 324/537, 415, 418; 439/189, 511
 See application file for complete search history.

(56) References Cited

U.S. PATENT DOCUMENTS

| | | | |
|---|---|---|---|
| 5,005,129 A | 4/1991 | Abe et al. | |
| 5,568,033 A | 10/1996 | Brunson | |
| 5,621,277 A * | 4/1997 | Ricca | 315/86 |
| 5,916,287 A | 6/1999 | Arjomand et al. | |
| 6,459,268 B1 * | 10/2002 | Lutz | 324/418 |

(Continued)

OTHER PUBLICATIONS

Ju-Young Jung, Prism: Zooming in persistent RAM storage behavior, IEEE 978-1-61284-368-1/11-2011 IEEE p. 22.*

(Continued)

*Primary Examiner* — Tung X Nguyen
*Assistant Examiner* — Giovanni Astacio-Oquendo
(74) *Attorney, Agent, or Firm* — Jones Day

(57) ABSTRACT

A diagnostic tool for monitoring a component in a load electrical circuit is provided. The diagnostic tool includes a housing containing a relay, at least one electrical sensor, a computer readable memory and a processor. The relay is configured for selectively open and close the load electrical circuit according to a control electrical circuit. The at least one sensor is configured to measure current and/or voltage in the load electrical circuit and to generate signals corresponding to the electrical load drawn through the load electrical circuit. The processor is in electrical with the sensor or sensors and the computer readable memory for storing data in the computer readable memory corresponding to the signals generated by the sensor.

13 Claims, 3 Drawing Sheets

(56) References Cited

U.S. PATENT DOCUMENTS

| | | | |
|---|---|---|---|
| 6,697,763 B1* | 2/2004 | Wilkins et al. | 702/183 |
| 6,757,665 B1 | 6/2004 | Unsworth et al. | |
| 6,759,849 B2 | 7/2004 | Bertness et al. | |
| 6,832,141 B2 | 12/2004 | Skeen et al. | |
| 6,925,335 B2 | 8/2005 | May et al. | |
| 7,132,762 B2 | 11/2006 | Metlitzky et al. | |
| 7,571,034 B2 | 8/2009 | Raichle et al. | |
| 7,786,851 B2 | 8/2010 | Drew et al. | |
| 7,805,228 B2 | 9/2010 | Liebl et al. | |
| 2002/0004694 A1* | 1/2002 | Mcleod et al. | 701/29 |
| 2004/0017203 A1* | 1/2004 | Becker et al. | 324/507 |
| 2004/0055304 A1* | 3/2004 | Shimizu et al. | 60/698 |
| 2005/0203683 A1* | 9/2005 | Olsen et al. | 701/35 |
| 2006/0184295 A1 | 8/2006 | Hawkins et al. | |
| 2008/0062604 A1* | 3/2008 | Brombach et al. | 361/100 |
| 2008/0318467 A1* | 12/2008 | Denomme et al. | 439/511 |
| 2009/0055044 A1 | 2/2009 | Dienst | |
| 2009/0063745 A1 | 3/2009 | Morris et al. | |
| 2009/0139781 A1* | 6/2009 | Straubel | 180/65.1 |
| 2009/0265057 A1 | 10/2009 | Chinnadurai et al. | |
| 2010/0042288 A1 | 2/2010 | Lipscomb et al. | |
| 2010/0176830 A1* | 7/2010 | Watson | 324/754 |
| 2010/0204878 A1* | 8/2010 | Drew et al. | 701/33 |
| 2010/0299020 A1 | 11/2010 | Koepf et al. | |
| 2011/0035095 A1 | 2/2011 | Chinnadurai et al. | |
| 2011/0054732 A1 | 3/2011 | Jardine et al. | |
| 2011/0106371 A1 | 5/2011 | Jardine et al. | |
| 2011/0125366 A1 | 5/2011 | Bertosa et al. | |

OTHER PUBLICATIONS

International Search Report mailed May 17, 2013 (PCT/US2013/024367).

Cal-Van Tools website "Relay Circuit Diagnostic Tool", http://www.cal-vantools.com/p-167-relay-circuit-diagnostic-tool.aspx (Feb. 1, 2013).

Your Diagnostic Tools website "uActivate", http://uactivate.yourdiagnostictools.com/2011/03/uactivate-overview/ (Feb. 1, 2013).

* cited by examiner

ELECTRICAL DIAGNOSTIC TOOL

BACKGROUND OF THE INVENTION

1. Field of the Invention

The present invention relates generally to the field of electrical diagnostics and more particularly to tools for monitoring electrical components.

2. Related Art

Many of the electrical diagnostic tools currently available on the market are complex, require much time to set up, require modifications to the component to be monitored and provide a limited amount of data. Oftentimes, the diagnostic tools are only able to detect real-time data, which may not always be useful for attempting to diagnose intermittent (non-continuous) problems. As such, diagnosing problems of many electrical vehicular and non-vehicular electrical components is often time consuming and costly. For example, if a fuel pump in a vehicle is malfunctioning, a mechanic oftentimes must remove the fuel pump from the vehicle before it can be tested. The process of removing the fuel pump alone is oftentimes time consuming and requires special parts and tools. Even then, if the electrical problem is intermittent, the mechanic may have difficulty reproducing it outside of the vehicle.

SUMMARY OF THE INVENTION

One aspect of the present invention provides for a diagnostic tool for monitoring a component in a first electrical circuit. The diagnostic tool includes a housing containing a relay, at least one electrical sensor and a processor, and a computer readable memory is also provided. The relay is configured to selectively open and close the first electrical circuit according to a second electrical circuit. The at least one electrical sensor is configured to measure current and/or voltage in the first electrical circuit and generate signals corresponding to an electrical load being drawn through the first electrical circuit. In operation, the processor receives the signal or signals from the sensor or sensors and stores data in the computer readable memory corresponding to the signal or signals. This data may then be uploaded to a remote computer for processing.

The diagnostic tool is beneficial because certain components that might otherwise be difficult to access can be quickly and cheaply monitored without extensive modifications. For example, if the component is a passenger vehicle fuel pump, the diagnostic tool may be inserted into the vehicle's fuse box or relay/fuse power center in place of the fuel pump's relay. The vehicle may then be driven out on the road, and the data collected may be uploaded to a remote computer and analyzed to determine if there the fuel pump is malfunctioning. This is far simpler and more effective than other known processes for monitoring the fuel pump which usually involve removing the fuel pump from the vehicle. Additionally, the diagnostic tool may be used to find shorts and other electrical problems. By analyzing the data stored in the computer readable memory, voltage or current drops or spikes may indicate the presence of an electrical short.

Another aspect of the present invention provides for a method of monitoring a component in a first electrical circuit. The method includes the step of providing a diagnostic tool including a housing which contains a relay, at least one electrical sensor and a processor. The method proceeds with providing a computer readable memory. The method then continues with the step of selectively opening and closing the first electrical circuit with the relay according to a second electrical circuit. The method then proceeds with the step of generating at least one signal with the at least one sensor corresponding to an electrical load being drawn through the first electrical circuit. The method continues with the step of processing the at least one signal from the at least one sensor with the processor and storing data corresponding to the at least one signal on the computer readable memory.

BRIEF DESCRIPTION OF THE DRAWINGS

These and other features and advantages of the present invention will be readily appreciated, as the same becomes better understood by reference to the following detailed description when considered in connection with the accompanying drawings wherein.

DESCRIPTION OF THE ENABLING EMBODIMENT

Figure 1:
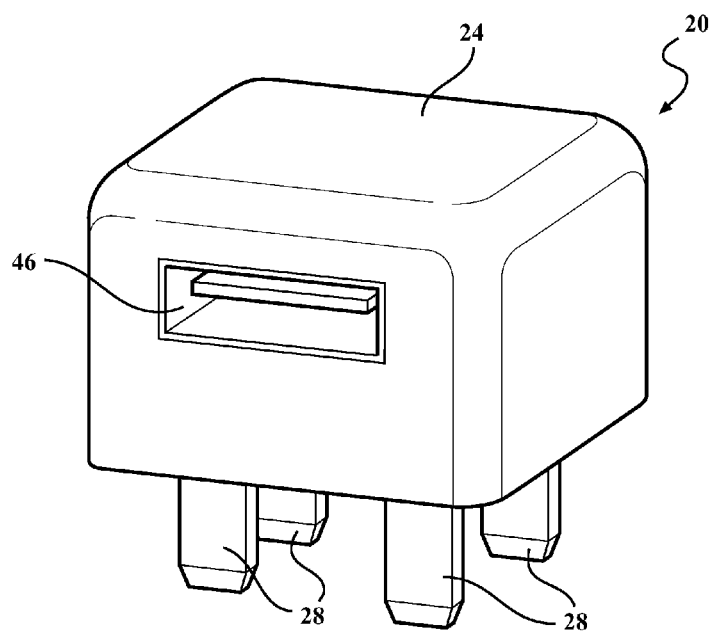
FIG. 1 is a perspective of a first exemplary embodiment of a diagnostic tool.
Figure 2:
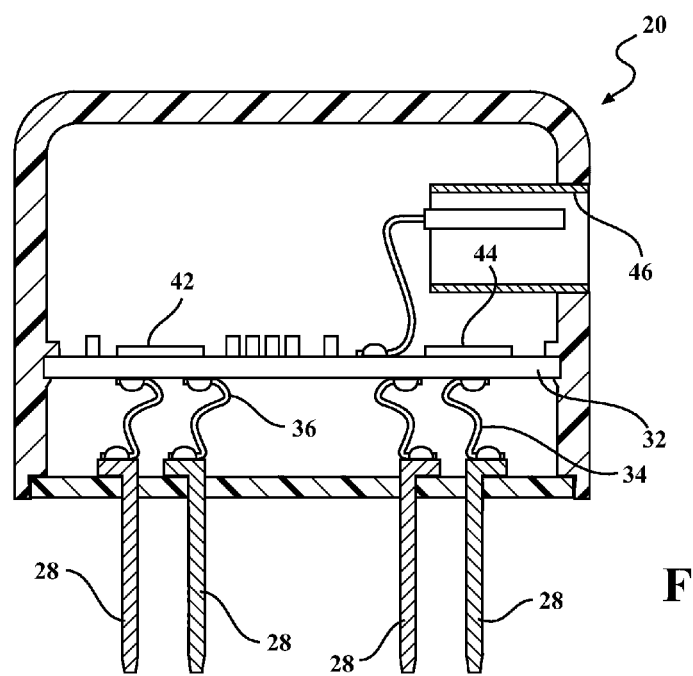
FIG. 2 is a cross-sectional view of the first exemplary embodiment of the diagnostic tool.
Figure 3:
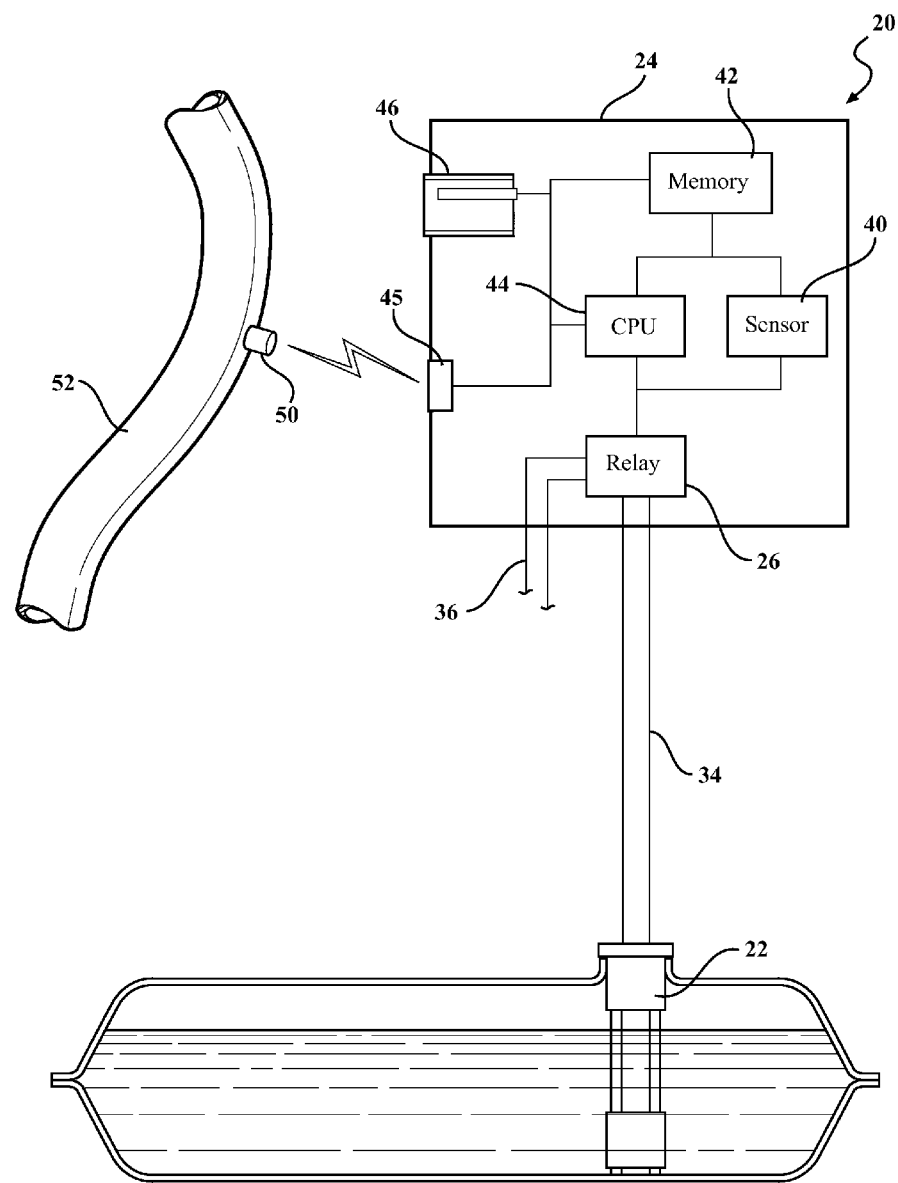
FIG. 3 is a schematic view of the first exemplary embodiment of the diagnostic tool configured to monitor a fuel pump and a fuel line.

Referring to the Figures, wherein like numerals indicate corresponding parts throughout the several views, a first exemplary embodiment of an electrical diagnostic tool 20 for monitoring the performance of an electrical component 22 is generally shown in FIGS. 1-3. Referring to the schematic view of FIG. 3, the diagnostic tool 20 includes a housing 24 which contains a relay 26 and plurality of leads 28 configured to plug into a fuse box (not shown) or a relay/fuse power center (not shown) of, for example, a passenger vehicle (not shown). As such, the electrical diagnostic tool 20 may be inserted in place of an existing relay which is in electrical connection with the component 22 to be monitored. In a passenger vehicle, electrical components 22 that could be monitored with the electrical diagnostic tool 20 include, for example, a fuel pump 22, a starter, a cooling fan, an air conditioning compressor, a windshield wiper system, headlamps, etc. Alternately, the electrical diagnostic tool 20 could be used to monitor electrical components 22 in a wide range of other vehicular or non-vehicular applications including, for example, building heating, ventilation, and air conditioning (HVAC) systems; heavy duty trucks; busses; boats; all-terrain vehicles; snowmobiles; etc.

Referring now to FIG. 1, the housing 24 of the exemplary diagnostic tool 20 is shaped similarly to a conventional International Standards Organization (ISO) automotive relay (not shown). Referring now to FIG. 2, the first exemplary embodiment of the diagnostic tool 20 is a solid state relay which includes a printed circuit board (PCB 32) that has electrical circuitry configured to automatically open and close a first electrical circuit (hereinafter referred to as a "load electrical circuit 34") according to a second electrical circuit (hereinafter referred to as a "control electrical circuit 36"). In other words, the solid state relay contained within the housing 24 of the first exemplary embodiment of the diagnostic tool 20 lacks the electromagnet and switch found in conventional electromechanical relays.

Referring back to FIG. 3, unlike a conventional solid state relay, the diagnostic tool 20 additionally includes at least one electrical sensor 40 for sensing an electrical load in the load electrical circuit 34. In the first exemplary embodiment, the electrical sensor 40 is incorporated into the circuitry of the PCB 32. However, it should be appreciated that the electrical sensor or sensors 40 could alternately be separate from the PCB 32. From its position within the vehicle's fuse box or relay/fuse power center, which is on the front end of the load electrical circuit 34, the diagnostic tool 20 may monitor the performance of the component 22. For example, if the component 22 is a fuel pump 22 of a passenger vehicle, as shown in the schematic view of FIG. 3, then depending on the type of electrical sensor or sensors 40 included in the housing 24, the diagnostic tool 20 will monitor the current and/or voltage being supplied to the fuel pump 22. From this, the performance of the fuel pump 22 may be monitored. For example, if the fuel pump 22 is drawing more current than would be expected, then its motor may be malfunctioning, and if the fuel pump 22 is experiencing periodic voltage drops or spikes, then there may be an electrical short somewhere in the load electrical circuit 34.

The exemplary diagnostic tool 20 also includes a computer readable memory 42, such as a solid state drive (SSD), and a processor 44 which are mounted on the PCB 32 within the housing 24. The processor 44 is in electrical communication with the sensor or sensors 40 and with the computer readable memory 42 for processing signals from the sensor or sensors 40 and storing data in the computer readable memory 42 corresponding to the current and/or voltage measurements taken by the electrical sensor or sensors 40. Alternately, the diagnostic tool 20 could have a wireless transmitter/receiver 45 which may be in communication with a computer readable memory external of the housing 24. The wireless transmitter/receiver 45 may be incorporated into the circuitry of the PCB 32 or may be a separate component. The electrical sensor or sensors 40 and the processor 44 may be configured to take samples of the current and/or voltage being applied to the fuel pump 22 at any desirable frequency during operation of the component 22 being monitored.

The load data is stored on the computer memory 42 so that it may be uploaded to an external computer (not shown), such as a laptop, a smart phone, a tablet or any other type of electrical device for analyzation. In the first exemplary embodiment, the diagnostic tool 20 includes a universal serial bus (USB) port 46 which is in electrical communication with the computer readable memory 42 for directly connecting with a computer (or similar electrical device) and allowing the computer to download the load data from the computer readable memory 42. However, it should be appreciated that the wireless transmitter/receiver 45 could alternately transmit the load data to the external computer wirelessly. The computer may then process the load data and determine whether the component 22 being monitored is operating properly or is malfunctioning. Accordingly, with the diagnostic tool 20, a user may determine whether the component 22 is functioning properly without actually accessing the component 22. This is particularly advantageous for hard to reach components, such as the fuel pumps 2 in passenger vehicles which sometimes can only be accessed by removing the vehicle's fuel tank. Also, the diagnostic tool 20 may be used to find electrical problems in vehicles by allowing a user to find electrical shorts by analyzing the load data for voltage or current drops or spikes.

Referring back to FIG. 3, the wireless transmitter/receiver 45 is shown in communication with a fuel pressure transducer 50 on a fuel line 52 of a passenger vehicle. The wireless communication could be through radio frequency (RF) signals, Bluetooth signals or any other type of wireless signals. The fuel pressure transducer 50 supplies fuel pressure data to the diagnostic tool 20, which stores the fuel pressure data on its memory 42 along with the load data described above. The fuel pressure data may be uploaded to a remote computer, a tablet, a smart phone or any other electrical device in the same manner as the load data described above. It should be appreciated that other non-electrical data could be wirelessly transmitted to the diagnostic tool 20 in a similar manner.

Figure 4:
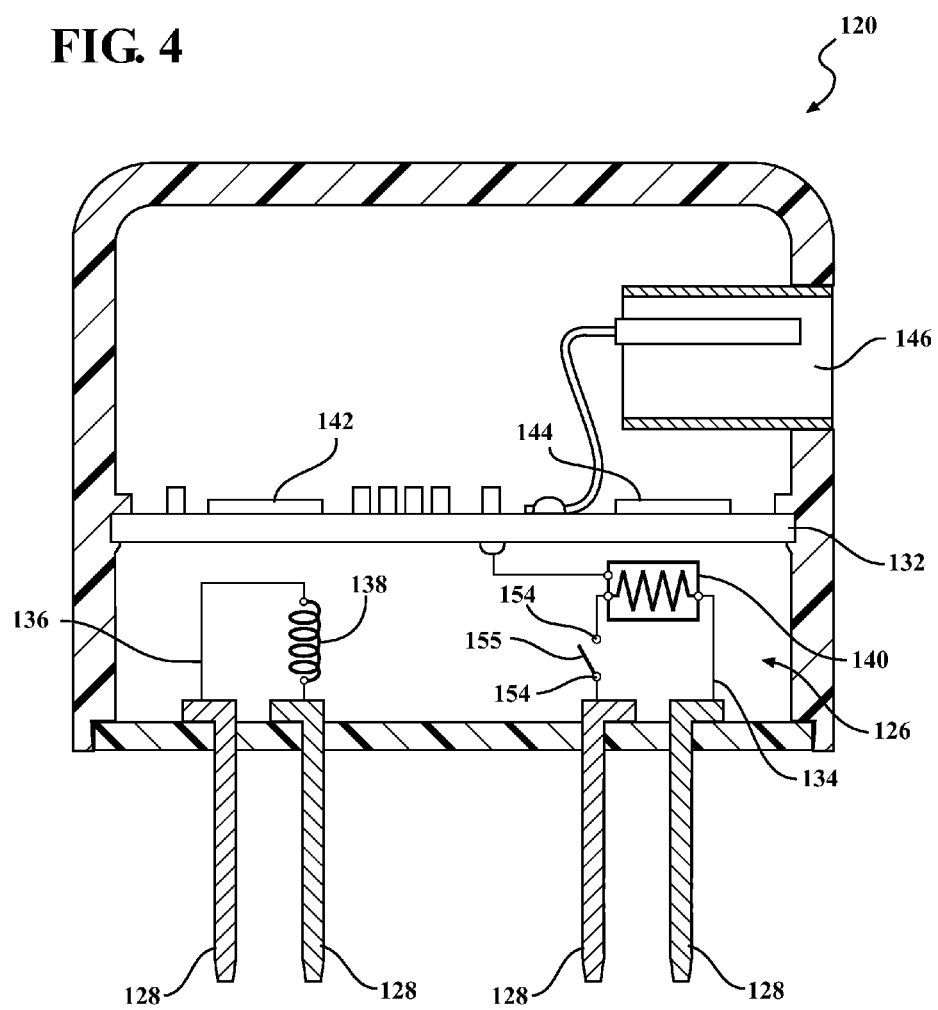
FIG. 4 is a cross-sectional view of a second exemplary embodiment of the diagnostic tool.

Referring now to FIG. 4, a second exemplary embodiment of the diagnostic tool 120 is shown with like numerals separated by a factor of 100 indicating parts corresponding to the first exemplary embodiment described above. The second exemplary embodiment is distinguished from the first exemplary embodiment described above by the relay 126 being of the electromechanical type. Specifically, the relay 126 includes an electromagnet 138 incorporated into the control electrical circuit 136 and a pair of contacts 154 and a switch incorporated into the load electrical circuit 134. Also, the electrical sensor 140 is incorporated into the load electrical circuit 134, not into the PCB 132 as it is in the first exemplary embodiment discussed above.

Another aspect of the present invention is a method of monitoring a component 22 in a load electrical circuit 34, 134. The method includes the step of providing a diagnostic tool 20, 120 including a housing 24, 124 which contains a relay 26, 126, at least one electrical sensor 40, 140, a computer readable memory 42, 142 and a processor 44, 144. The relay 26, 126 in the diagnostic tool 20, 120 could be either a solid state relay 26 or an electromechanical relay 126 having an electromagnet 138 and a set of contacts 154. The method continues with the step of selectively opening and closing the load electrical circuit 34, 134 with the relay 26, 126 according to a control electrical circuit 36, 136. The method continues with the step of generating at least one signal with the sensor or sensors 40, 140 corresponding to the electrical load being drawn through the load electrical circuit 34, 134. The electrical sensor or sensors 40, 140 may be configured to measure current and/or voltage in the load electrical circuit 34, 134. The method then proceeds with the step of processing the signal or signals from the sensor or sensors 40, 140 with the processor 44, 144 and storing data corresponding signal signals on the computer readable memory 42, 142. The method continues with the step of transferring data from the computer readable memory 42, 142 to a remote computer via a wireless transmitter/receiver 45 or a computer port, such as a USB port 46, 146.

Obviously, many modifications and variations of the present invention are possible in light of the above teachings and may be practiced otherwise than as specifically described while within the scope of the appended claims.

What is claimed is:

1. A diagnostic device comprising:
two rigid control leads;
two rigid load leads;
an internal relay mechanism configured to selectively conduct electricity between the two load leads based on whether an electrical current is applied across the two control leads;
a sensor configured to provide measurements of voltage or current sensed at the load leads,
a data memory,
a processor configured to input the measurements from the sensor and store the measurements in the data memory,
a computer interface configured to send the stored measurements to a computer, and
a housing that houses the internal relay, the sensor, the memory, the processor and the computer interface;
wherein the control leads and the load leads have the same pin configuration as an existing relay that lacks a sensor, lacks a data memory and lacks a computer interface, such that the diagnostic device is configured to be plugged into a relay receptacle in place of the existing relay.

2. The diagnostic device of claim 1, wherein the computer interface comprises a USB port.

3. The diagnostic device of claim 1, wherein the computer interface comprises a wireless transmitter.

4. The diagnostic device of claim 1, wherein the measured parameter is current.

5. The diagnostic device of claim 1, wherein the measured parameter is voltage.

6. The diagnostic device of claim 1, wherein the internal relay includes (i) an electromagnet connected across the control leads of the diagnostic device and (ii) a magnetically-activated switch connected across the load leads of the diagnostic device.

7. The diagnostic device of claim 1, wherein the internal relay is a solid state relay.

8. The diagnostic device of claim 1, wherein the control leads and the load leads are blade connectors with beveled ends.

9. An apparatus comprising:
the diagnostic device of claim 1;
a motor configured to be powered by motor-driving current; and
a relay receptacle into which the diagnostic device is configured to be plugged, wherein the relay receptacle is configured to conduct a control signal across the two control leads and to conduct the motor-driving current across the two load leads for the motor-driving current to be controlled by the control signal.

10. The apparatus of claim 9, wherein the relay receptacle is part of a motor vehicle.

11. The apparatus of claim 9, wherein the motor is part of a fuel pump.

12. A method performed with the apparatus of claim 9, the method comprising:
unplugging the existing relay from the receptacle; and
plugging the diagnostic device into the receptacle in place of the existing relay.

13. The method of claim 12, further comprising:
transferring the data from the memory to a remote computer via the computer interface.

* * * * *